United States Patent
Jung et al.

(10) Patent No.: US 9,100,038 B2
(45) Date of Patent: Aug. 4, 2015

(54) DECODING FUNCTION SELECTION DISTRIBUTED TO THE DECODER

(75) Inventors: Joël Jung, Le Mesnil Saint Denis (FR); Guillaume Laroche, Rennes (FR)

(73) Assignee: Orange, Paris (FR)

( * ) Notice: Subject to any disclaimer, the term of this patent is extended or adjusted under 35 U.S.C. 154(b) by 768 days.

(21) Appl. No.: 12/667,072

(22) PCT Filed: Jun. 19, 2008

(86) PCT No.: PCT/FR2008/051101
§ 371 (c)(1),
(2), (4) Date: Dec. 29, 2009

(87) PCT Pub. No.: WO2009/004255
PCT Pub. Date: Jan. 8, 2009

(65) Prior Publication Data
US 2010/0195740 A1 Aug. 5, 2010

(30) Foreign Application Priority Data
Jun. 29, 2007 (FR) ...................................... 07 04710

(51) Int. Cl.
H04N 11/02 (2006.01)
H03M 7/30 (2006.01)
H04N 19/12 (2014.01)

(52) U.S. Cl.
CPC ................. *H03M 7/30* (2013.01); *H04N 19/12* (2014.11)

(58) Field of Classification Search
CPC ........................... H03M 7/30; H04N 19/00078
USPC ....................................... 375/240.25, 240.16
See application file for complete search history.

(56) References Cited

U.S. PATENT DOCUMENTS

| | | | | |
|---|---|---|---|---|
| 2001/0001614 A1* | 5/2001 | Boice et al. | .............. | 375/240.24 |
| 2003/0081845 A1* | 5/2003 | Mukherjee et al. | ........... | 382/239 |
| 2004/0146109 A1* | 7/2004 | Kondo et al. | ............. | 375/240.16 |
| 2004/0233989 A1* | 11/2004 | Kobayashi et al. | ...... | 375/240.16 |
| 2005/0089235 A1* | 4/2005 | Sakaguchi et al. | ............ | 382/239 |
| 2005/0163216 A1* | 7/2005 | Boon et al. | ............... | 375/240.12 |
| 2005/0175101 A1* | 8/2005 | Honda et al. | ............. | 375/240.16 |
| 2005/0249290 A1* | 11/2005 | Gordon et al. | ........... | 375/240.18 |
| 2007/0171974 A1* | 7/2007 | Baik | ........................ | 375/240.12 |

(Continued)

OTHER PUBLICATIONS

Chang et al., "A Simple Block-Based Lossless Image Compression Scheme," Conference Record of the Thirtieth Asilomar Conference on Signals, Systems and Computers, 1996, Pacific Grove, CA, USA, Nov. 3-6, 1996, Los Alamitos, CA, USA, IEEE Comput. Soc., US, pp. 591-595 (Nov. 3, 1996).

(Continued)

*Primary Examiner* — Anner Holder
(74) *Attorney, Agent, or Firm* — Drinker Biddle & Reath LLP

(57) ABSTRACT

The present invention relates to a method of transmitting at least one current image portion, wherein the method comprises selecting a coding function from a finite set of coding functions by applying at least one choice function of a first type, said choice function or functions of said first type using already-decoded image data, coding the current image portion using the selected coding function, sending the coded image portion to a decoder, and sending to said decoder information describing the choice function or functions of said first type. The invention also relates to the corresponding decoding method.

16 Claims, 2 Drawing Sheets

(56) References Cited

U.S. PATENT DOCUMENTS

2007/0189392 A1* 8/2007 Tourapis et al. ......... 375/240.21
2007/0217508 A1* 9/2007 Shimada et al. ......... 375/240.03
2008/0267291 A1* 10/2008 Vieron et al. ............ 375/240.16

OTHER PUBLICATIONS

Jung et al., "RD-Optimized Competition Scheme for Efficient Motion Prediction," Proceedings of SPIE, vol. 6508, pp. 1-11, retrieved from internet website: http://spiedl.aip.org/getpdf/servlet/GetPDFServlet?filetype=pdf&id=PSISDG006508000001650815000001&idtype=cvips&prog=normal (Jan. 29, 2007).

Laroche et al., "A Spatio-Temporal Competing Scheme for the Rate-Distortion Optimized Selection and Coding of Motion Vectors," Proceedings of 14$^{th}$ European Signal Processing Conference (EUSIPCO 2006), Florence, Italy, Sep. 4-8, 2006, pp. 1-5, URL: http://www.eurasip.org/Proceedings/Eusipco/Eusipco2006/papers/1568981220.pdf (Sep. 2006).

Office Action established for JP 2010-514053 (Jul. 17, 2012).

\* cited by examiner

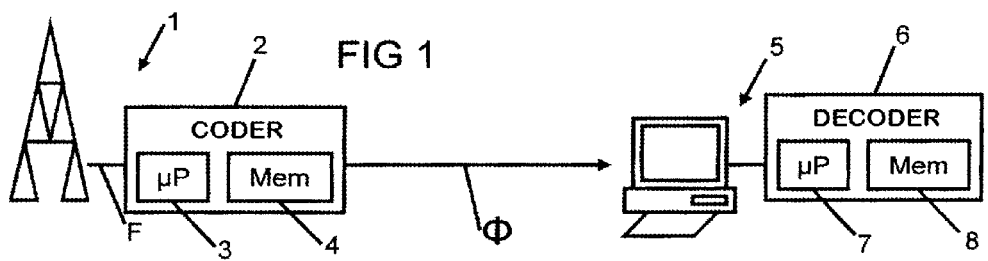
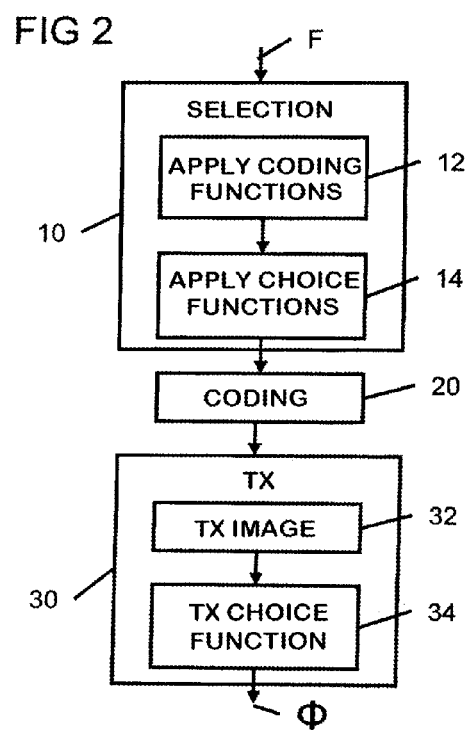
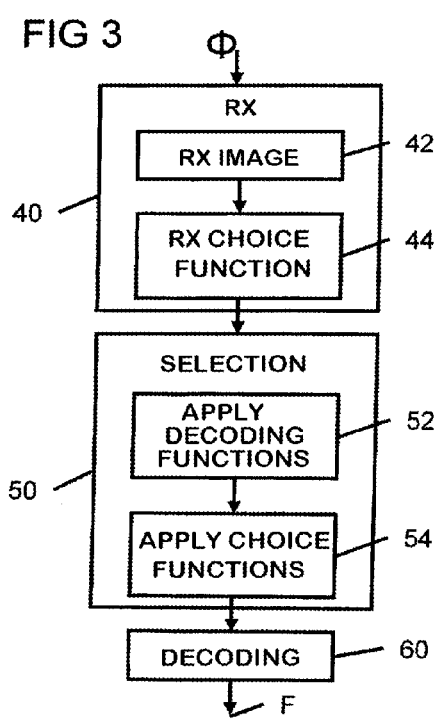

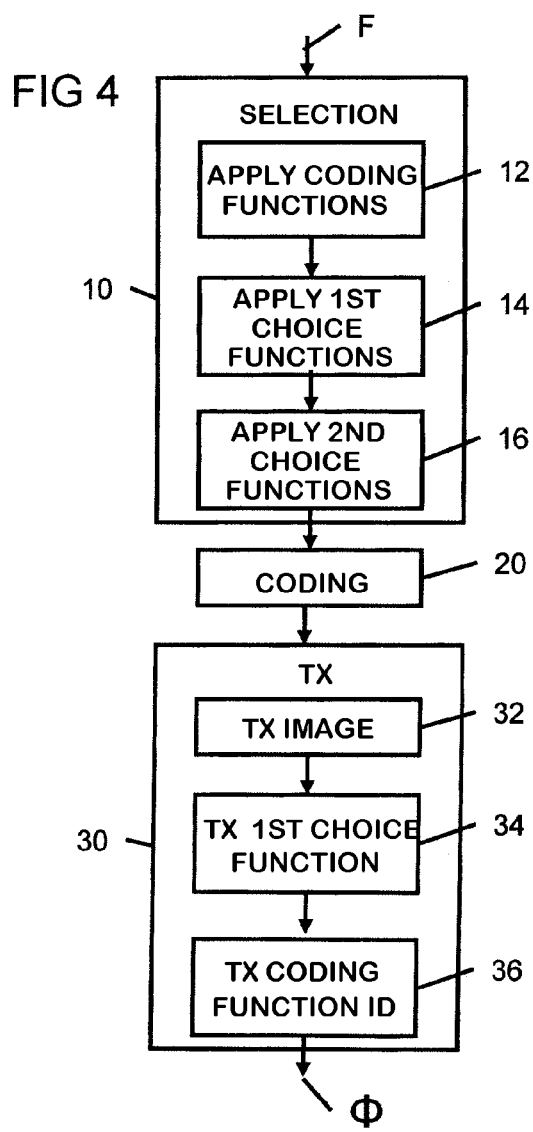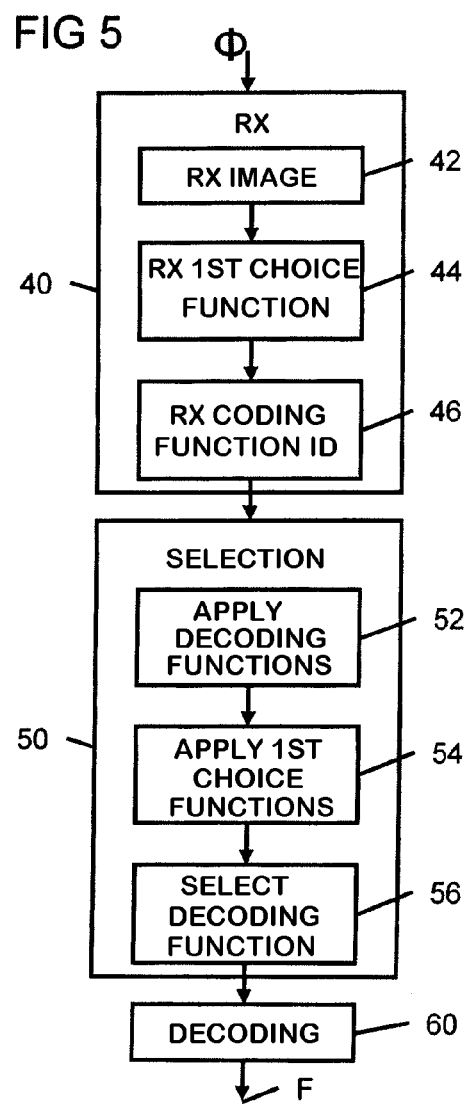

DECODING FUNCTION SELECTION DISTRIBUTED TO THE DECODER

CROSS-REFERENCE TO RELATED APPLICATIONS

This application is the U.S. national phase of the International Patent Application No. PCT/FR2008/051101 filed Jun. 19, 2008, which claims the benefit of French Application No. 07 04710 filed Jun. 29, 2007, the entire content of which is incorporated herein by reference.

BACKGROUND

The present invention relates to competitive techniques for coding and decoding information.

Several coding and decoding methods exist for transmitting images. A distinction is made in particular between main types of coding such as intra coding in which an image is coded autonomously, i.e. without reference to other images, and inter coding in which a current image is coded relative to past images in order to express and send only the difference between those images.

Regardless of the type of coding, numerous coding and decoding functions are available. For inter coding, for example, the coding functions are the various prediction functions that can be used.

A particular coding function is conventionally selected by competition between different available functions with selection being on the basis of a choice criterion or choice function. For example, one standard criterion used in order to arrive at a compromise between quality and bandwidth is the ratio between the distortion resulting from coding and the bit rate.

In standard image coding and decoding environments, this choice is effected unilaterally in the coder. The result of this is the selection of a coding function that must be sent to the decoder each time it changes.

In such implementations, the decoder has a passive role and its calculation and processing capacities are underused.

In particular, in standard systems a large amount of information describing the coding function is used and consumes a non-negligible portion of the bandwidth. What is more, the quantity of descriptive information and the frequency of changes increase with the size of the set of coding functions available.

SUMMARY

Advantages of the present invention are that it optimizes use of bandwidth and that it improves on the above situation by enabling some of the calculation and processing to be carried out in the decoder.

To this end, the invention provides a method of transmitting at least one current image portion, the method being characterized in that it comprises:
  selecting a coding function from a finite set of coding functions by applying at least one choice function of a first type, said choice function or functions of said first type using already-decoded image data;
  coding the current image portion using the selected coding function;
  sending the coded image portion to a decoder; and
  sending to said decoder information describing the choice function or functions of said first type.

In a corresponding way, the invention also provides a method of decoding at least one current image portion, the method being characterized in that it comprises:
  receiving a coded current image portion;
  receiving information describing at least one choice function of a first type that has been used;
  selecting a decoding function from a finite set of decoding functions using said choice function or functions of said first type, said choice function or functions of said first type using already-decoded data; and
  decoding the current image portion using the selected decoding function.

By means of the above methods, the decoder has access to information relating to the choice function and enabling it to act autonomously to reproduce selection operations effected in the coder. Furthermore, since changes of selection criterion are less frequent than changes of coding/decoding function, the amount of data sent unnecessarily is reduced.

In one particular implementation, the application of said choice function(s) of said first type yield(s) a respective unique coding and decoding function.

Consequently, the decoder is able to identify with certainty the decoding function to be used and it is not necessary to send corresponding descriptive information.

In another implementation, in the coding method said choice function or functions of said first type yield(s) a group of valid coding functions and the method further comprises:
  applying at least one choice function of a second type for selecting a coding function from said group of valid functions;
  determining an identifier of the selected decoding function expressed relative to said group; and
  sending said identifier to the decoder.

In such an implementation, in the decoding method said choice function or functions of said first type yield(s) a group of valid decoding functions and the method further comprises:
  receiving an identifier of a decoding function; and
  selecting a decoding function as a result of applying said identifier to said group of valid decoding functions.

It is thus possible to send an identifier that is smaller because it is expressed relative to a group of smaller size than the set of all existing functions.

In a further implementation, the choice function or functions of the first type is or are selected from an indexed set of choice functions and said corresponding descriptive information is expressed relative to said indexed set. This enables simple and efficient transmission of information describing the choice functions.

The method advantageously includes a preliminary stage of communication between a coder and a decoder to determine said indexed set of choice functions. This enables the list of choice functions to be adapted and to evolve.

In another implementation, at least one of said choice functions of the first type has parameters and said descriptive information includes parameter information.

Thus the same choice function can have its parameters set in different ways to constitute a commensurate number of different functions.

Furthermore, the invention also provides corresponding programs and devices.

BRIEF DESCRIPTION OF THE DRAWINGS

Other features and advantages of the present invention emerge from the following description, which is given by way of non-limiting example and with reference to the appended drawings, in which:

FIG. 1 is a diagram showing two communicating stations respectively provided with a video coder and a video decoder;

FIGS. 2 and 3 are flowcharts of coding and decoding methods of a first implementation of the invention; and FIGS. 4 and 5 are flowcharts of coding and decoding methods of a second implementation of the invention.

DETAILED DESCRIPTION OF PREFERRED EMBODIMENTS

The invention is applicable to any image coding and decoding system, such as the system represented in FIG. 1. That system codes a video sequence of a digital television stream F and transmits it from a transmitter station 1 containing a video coder 2 including a controller or computer 3 associated with a memory 4, to a receiver station 5 containing a decoder 6 also including a controller or computer 7 and a memory 8.

For example, the transmitter 1 includes an antenna transmitting on a digital television channel a data stream Φ with a format such as the DVB format and the station 5 is a personal computer.

Coding according to a first implementation of the invention is described below with reference to FIG. 2.

The coder 2 receives a stream F of image data of a video sequence. This stream is processed in order to code each image or image portion. The term "image" refers generally to an element of the video sequence. As a function of the standard used, the term "image" may interchangeably be replaced by the term "frame" and the term "portion" by the term "block".

The method includes firstly a step 10 of selecting a coding function from a finite set of coding functions by a competitive process using one or more choice functions.

In the implementation described, selection includes a step 12 of applying each available coding function to the current image portion.

Selection 10 then includes a step 14 of applying the choice function or functions.

In this implementation, a choice function is discriminatory in the sense that it yields a single result.

For example, the coding functions are grouped by type or mode, such as the intra, inter and other coding modes, and a candidate coding function is chosen for each mode. Thus the coding functions of each mode are first compared to each other using choice functions specific to each mode to determine one candidate coding function per mode.

The selection step 10 then includes choosing a coding function from the candidate coding functions by applying a choice function adapted to compare coding functions for the various modes.

Of course, a greater or lesser depth of choice can be applied in the selection step. In particular, additional levels of choice can be applied for the following criteria:
- choosing the reference image in the inter mode;
- choosing the order in which the image coefficients are dealt with (by row, by column, zig-zag, etc.);
- choosing the pixel accuracy for estimating movement;
- choosing the movement vector;
- choosing the movement vector predictor in inter mode coding;
- choosing the transform;
- etc.

Furthermore, the step 14 of applying choice functions is reproducible in the coder, i.e. the choice functions are executed on the basis of already-decoded image data. The coder knows that this data has already been decoded in the decoder.

For example, a standard choice criterion such as the distortion/bit rate ratio calculated on the basis of the distortion suffered by the current image is not usable by these choice functions because the current image is not part of the already-decoded data.

Accordingly, the selection step 10 is similar in principle to selection by competition in the standard way but uses specific choice criteria.

It is nevertheless possible to use criteria similar to the standard criteria such as the distortion/bit rate ratio by considering the distortion of reference pixels external to the image to be coded and belonging to already-decoded data.

Numerous choice functions based on statistics or characteristics of the already-decoded data can be used as indicated below.

The method then includes coding 20 the current image portion using the selected coding function. In the implementation described here, as the selection step 10 entails applying the coding functions in turn, this step 20 corresponds uniquely to extracting the results of applying the selected coding function. In implementations in which the results of applying the coding functions are not available, this coding step corresponds to direct application of the selected coding function.

The method subsequently includes a step 30 of sending information to the decoder 6. This transmission step 30 includes a step 32 of transmitting the current image portion in its coded form and a step 34 of transmitting information describing the choice function or functions used.

The descriptive information can be of different kinds. In particular, it can include an explicit description of the choice functions. In the implementation described here, the choice functions are listed in the coder and the decoder and are indexed jointly. Sending information describing the choice function used then simply entails sending the identifier of the choice function expressed relative to this index common to the coder and the decoder.

In the coder, the transmission step 30 corresponds to inserting data into an output stream.

For example, table 1 below gives the index of different choice functions for a predictor in the situation of competitive inter mode coding of movement vectors.

| Index | Choice functions |
| --- | --- |
| 0 | Proprietary: the coder uses a choice function that does not belong to the list of functions normalized by the decoder |
| 1 | Choice function founded on the calculated cost as in the H.264 standard |
| 2 | Choice function founded on the simplified cost for a real-time mode |
| 3 | Choice function founded on the real cost (complete RD optimization) |
| 4 | Choice function founded on a statistical criterion |
| 5 | Choice function founded on a local criterion |
| ... | ... |

In the above table, the choice 0 indicates that the coder does not wish to inform the decoder of the choice function used. An identifier of the coding function expressed relative to the set of all existing functions is sent. This mode corresponds to the standard operating mode of a coder and decoder system. Thus the list of the choice functions that is common to the coder and the decoder includes the possibility of operating in the standard way, i.e. of using a choice function that is not known except by the coder and the results of which must be sent.

The indices 1, 2, and 3 correspond to choice functions that are variations of the distortion/bit rate criterion that are more or less complex according to the implementation constraints.

The indices 4 and 5 correspond to choice functions such that the coding function is selected as a function of statistical criteria or local criteria, respectively. For example, selection applies to a coding function that is statistically very frequent or to a coding function that is used a lot at the local level, i.e. is frequently used for adjacent macroblocks already coded.

Different possible choice functions in the situation of intra coding are shown in table 2 below.

| Index | Choice functions |
| --- | --- |
| 0 | Proprietary: the coder uses a choice function that does not belong to the list of functions normalized by the decoder |
| 1 | Choice function founded on a statistical criterion + RD |
| 2 | Choice function founded on a vicinity criterion |
| 3 | Choice function founded on a directional criterion |
| ... | ... |

As indicated above, intra coding functions correspond to predictions using only the spatial redundancies of the images. According to the H.264 standard, there are 184 coding possibilities for an intra coded macroblock.

In the above table, the choice 0 corresponds, as before, to a standard type of operation.

For the index 1 or 2, the coder chooses a coding function for the current macroblock as a function of the choices made for the macroblocks already coded.

To be more precise, choice function 1 leads to selecting coding functions according to selection statistics of the various modes followed by selecting the optimum coding function according to a distortion/bit rate criterion.

Choice function 2 means that nearby blocks are all coded using the same coding function, which is selected automatically. Of course, it is possible to segment the nearby blocks into subgroups and to associate a choice function with each subgroup.

Choice function 3 results in choosing a coding function according to the favored direction of the directional gradients of the nearby blocks.

Sending the information necessary for making the choice to the decoder ensures that the decoder is capable of retrieving the decoding function corresponding to the coding function used without it being necessary to send information describing the coding function used. This optimizes the use of bandwidth by suppressing the information describing the coding function used.

The choice functions are used for longer than the coding functions with the result that the overall useful bandwidth for sending information relating to the choice functions is increased compared to sending information relating to the coding functions.

The decoding method corresponding to the coding method described above is described below with reference to FIG. 3.

This method begins with a receiving step 40 comprising a step 42 of receiving the coded current image portion and a step 44 of receiving information describing the choice function or functions used.

The step 40 is followed by a step 50 of selecting a decoding function from a finite set of decoding functions corresponding to the finite set of coding functions used during the selection step 10.

In the implementation described here, this selection step commences with a step 52 of applying each available decoding function and then a step 54 of applying the identified choice function or functions to selecting a decoding function.

In the implementation described here, this application comprises choosing a candidate function for each mode and then choosing a function from said candidate functions in a manner corresponding to the choice step 14 described with reference to FIG. 2.

The choice functions being discriminatory and applied at the decoder level, i.e. using only decoded data, this application step 54 yields a unique decoding function corresponding to the coding function used in the step 20.

The decoding method finally includes a decoding step 60 that applies the selected decoding function.

In the implementation described here, this step corresponds to extracting the results of the selected decoding function relating to all the results stored at the time of the application step 52.

Another implementation of the invention is described below with reference to FIGS. 4 and 5. In these figures, steps identical to steps of the previous implementation carry the same reference numbers.

The coding represented in FIG. 4 begins in the same manner as before.

However, in this implementation, the step 14 of applying the choice functions, referred to as first choice functions, is not discriminatory, i.e. these functions do not lead to the identification of a unique coding function but rather of a group of coding functions referred to as the group of valid coding functions. The choice functions used in the first implementation are functions of this type.

A second type of choice functions is then used during a choice step 16 to yield a unique coding function selected from the group of valid coding functions. The choice functions of the second type use interchangeably already-decoded data or not already-decoded data. Choice functions of this type are applied only at the coder level and only the result is sent to the decoder.

In this implementation, the transmission step 30 includes a step 36 of sending an identifier of said unique coding function actually used. This identifier is expressed relative to the group of valid coding functions.

Applying the first choice functions yields an indexed set of coding functions. Applying the second choice functions selects a coding function from this set.

Applying the first choice functions being reproducible at the decoder level, the identifier of the coding function selected can be expressed relative to the group of valid coding functions.

That identifier being expressed relative to a function group smaller than the set of available functions, it is smaller than a standard identifier, which economizes on bandwidth.

In the implementation described here, this identifier is the number of the function expressed relative to an index of the group of valid coding functions.

For example, the coder and the decoder use coding and decoding functions over windows the size of which varies from 64 to 2 in multiples of 2. The set of all valid functions is then expressed in simplified form as a table like table 3 below:

| Index | Coding/decoding function |
| --- | --- |
| 0 | Coding/decoding with window of size 2 |
| 1 | Coding/decoding with window of size 4 |
| 2 | Coding/decoding with window of size 8 |
| 3 | Coding/decoding with window of size 16 |
| 4 | Coding/decoding with window of size 32 |
| 5 | Coding/decoding with window of size 64 |

A first choice function imposes a given image resolution or an image resolution that is greater than a given value. For example, this first choice function imposes a window size greater than 4 with the result that coding/decoding functions with indices 0 and 1 that correspond to partitions of size 2 and 4 are simply prohibited.

The group of valid coding/decoding functions is then the group represented by table 4 below:

| Index | Coding/decoding function |
|-------|--------------------------|
| 0 | Coding/decoding with window of size 8 |
| 1 | Coding/decoding with window of size 16 |
| 2 | Coding/decoding with window of size 32 |
| 3 | Coding/decoding with window of size 64 |

Another first choice function imposes elimination of small partitions as a function of a criterion relating to the homogeneity of the processed area. Consequently, the group of valid coding/decoding functions corresponds to table 5 below:

| Index | Coding/decoding function |
|-------|--------------------------|
| 0 | Coding/decoding with window of size 16 |
| 1 | Coding/decoding with window of size 32 |
| 2 | Coding/decoding with window of size 64 |

The second choice (window of size 16) selects a coding function from the three coding functions forming the group of valid functions. The identifier of the selected function is expressed relative to this group and to the corresponding smaller index.

In the decoding method represented in FIG. 5, the reception step 40 includes, in addition to the step 42 of receiving the coded image and the step 44 of receiving information describing the first choice functions, the step 46 of receiving the identifier of the coding function used.

Moreover, during the selection step 50, the step 52 of applying the first choice functions produces only the group of valid decoding functions corresponding to the group of valid coding functions ascertained following the choice step 14.

The method then comprises a step 56 of selecting the coding function with the aid of the identifier received during the step 46.

Following this selection step 56, the decoding function is identified and is applied in the step 60.

Accordingly, by means of the invention, the choice of a coding function effected in the coder can be reproduced in the decoder. This has the advantage of significantly reducing the bandwidth allocated to the information identifying the coding function by expressing it relative to a group of smaller size or eliminating it completely.

Of course, other implementations can be envisaged.

In each of these cases, additional parameters can accompany the choice functions. For example, a second choice parameter can indicate that the distortion is calculated in the spatial domain using a sum of absolute differences (SAD) or in the frequency domain using a sum of absolute transformed differences (SATD). Similarly, evaluation of the bit rate can take account of the bandwidth cost of the coded image, the bandwidth cost of the identifier, etc.

For example, the choice functions can equally have parameters and information describing the parameters used can be sent from the coder to the decoder.

One example of an inter coding parameter is the number of reference images as a function of a temporal activity criterion over a given number of images preceding the current image.

Another example is the accuracy of the so-called "sub-pixel" movement compensation function.

In a further example, the choice function to be applied is based on minimizing the distortion/bit rate criterion. The bit rate is often considered as the sum of the bit rates of all the components of the bit stream according to the following equation:

$$R = R_r + \lambda_m R_m + \lambda_o R_o + \lambda_{mv} R_{mv}$$

In the above equation, $R_r$ is the bit rate of the block residual with the luminance and chrominance components, $R_m$ the bit rate of the coding mode, $R_{mv}$ the bit rate of the movement vector residual, and $R_o$ the bit rate of the other components comprising the header, the block structure, stuffing bits and other quantifiers.

The coefficients $\lambda$ are weighting coefficients depending on the quantization step. However, the values of these coefficients $\lambda$ are adapted as a function of the content of the video sequence in order to improve coding efficiency.

In this kind of implementation the information describing the choice function used includes modifications of the coefficients $\lambda$ on the basis of criteria depending on the input signal F of the coder.

For example, the table below sets out the modifications of the coefficients $\lambda$ that are sent.

| Indices | Choice functions |
|---------|------------------|
| 0 | Proprietary |
| 1 | Standard RD with lambda criterion |
| ... | Statistical criterion |
| 4 | Criterion with augmented movement lambda (the augmentation factor being normalized) |
| 5 | Criterion with movement lambda = f(characteristics) where characteristics are characteristics that can be calculated in the decoder (overall quantity of movement, presence of skipped blocks, etc.) |

Moreover, use of one or the other of the choice functions can be triggered by environmental parameters such as the evolution of the bit rate and the available bandwidth or by parameters linked to the equipment used. Accordingly, in mobile equipment the battery level can trigger the use of certain choice functions.

In one particular implementation, the coder and the decoder exchange the list of choice functions during a preliminary stage. Accordingly, each has the same list, simplifying the expression of the identifier of the choice function used. Such an implementation requires a bidirectional link between the coder and the decoder.

Both in the coder and in the decoder, implementation of the invention can be based on programs adapted to include the features described above. Of course, it is also possible to use dedicated processors or specific circuits.

In particular, it is possible to use programs executed by processors or computers for video processing devices in order to implement the coding or decoding described above. In particular, the computers 3 and 7 communicate with the memories 4 and 8, respectively, to implement the various steps of the coding and decoding methods conforming to the various possible implementations of the invention.

Moreover, it is possible to apply the invention in coders and corresponding decoders, which then include means for executing the functions identified above. These means include microprocessors, microcontrollers or other processors connected to memories and other components.

What is claimed is:

1. A method of transmitting at least one current image portion, the method comprising:
   precoding image data from said image portion with each coding function from a finite set of coding functions;
   selecting a coding function from said finite set of coding functions by applying a choice function, the selected coding function being an appropriate coding function among the finite set according to the choice function, said choice function using said precoded image data;
   coding the current image portion using the selected coding function;
   sending the coded image portion to a decoder; and
   sending to said decoder information describing the choice function, and not also sending information describing the coding function.

2. A method according to claim 1, wherein applying said choice function yields a unique coding function.

3. A method according to claim 1, wherein the choice function is selected from an indexed set of choice functions and said corresponding descriptive information is expressed relative to said indexed set.

4. A method according to claim 3, further comprising:
   communicating, in a preliminary stage, between a coder and a decoder to determine said indexed set of choice functions.

5. A method according to claim 1, wherein said at choice function has parameters and said descriptive information includes parameter information.

6. A non-transitory computer-readable storage medium with an executable program stored thereon, wherein the program instructs a microprocessor to perform a method, the method comprising:
   precoding image data from said image portion with each coding function from a finite set of coding functions;
   selecting a coding function from a finite set of coding functions by applying a choice function, the selected coding function being an appropriate coding function among the finite set according to the choice function, said choice function using the precoded image data;
   coding the current image portion using the selected coding function;
   sending the coded image portion to a decoder; and
   sending to said decoder information describing the choice function and not also sending information describing the coding function.

7. A device for transmitting at least one current image portion, the device comprising:
   means for precoding image data from said image portion with each coding function from a finite set of coding functions;
   means for selecting a coding function from a finite set of coding functions by applying a choice function, the selected coding function being an appropriate coding function among the finite set according to the choice function, said choice function using said precoded image data;
   means for coding the current image portion using the selected coding function;
   means for sending the coded image portion to a decoder; and
   means for sending to said decoder information describing the choice function and not also sending information describing the coding function.

8. A method of decoding at least one current image portion, the method comprising:
   receiving a coded current image portion;
   receiving information describing a choice function that has been used but not also receiving information describing a coding function;
   selecting a decoding function from a finite set of decoding functions using said choice function, the selected decoding function being an appropriate decoding function among the finite set according to the choice function, said choice function using already-decoded data; and
   decoding the current image portion using the selected decoding function.

9. A method according to claim 8, wherein said choice function yields a unique decoding function.

10. A method according to claim 8, wherein the choice function is selected from an indexed set of choice functions and said descriptive information is expressed relative to said indexed set.

11. A method according to claim 10, further comprising:
    communicating, in a preliminary stage, between a coder and a decoder to determine said indexed set of choice functions.

12. A method according to claim 8, wherein
    said choice function has parameters and said descriptive information includes parameter information.

13. A non-transitory computer-readable storage medium with an executable program stored thereon, wherein the program instructs a microprocessor to perform a method, the method comprising:
    receiving a coded current image portion;
    receiving information describing a choice function that has been used, but not also receiving information describing a coding function;
    selecting a decoding function from a finite set of decoding functions using said choice function, the selected decoding function being an appropriate decoding function among the finite set according to the choice function, said choice function using already-decoded image data; and
    decoding the current image portion using the selected decoding function.

14. A device for decoding at least one current image portion, the device comprising:
    image receiving means for receiving a coded current image portion;
    choice function receiving means for receiving information describing a choice function that has been used;
    selection means for selecting a decoding function from a finite set of decoding functions using said choice function, the selected decoding function being an appropriate decoding function among the finite set according to the choice function, said choice function using already-decoded image data, said selection means not also using received information describing a coding function; and
    decoding means for decoding the current image portion using the selected decoding function.

15. A device for transmitting at least one current image portion, comprising:
    a coding function selecting unit configured to precode image data from said image portion with each coding function from a finite set of coding functions;
    a selecting unit configured to select a coding function from a finite set of coding functions by applying a choice function, the selected coding function being an appropriate coding function among the finite set according to the choice function, said choice function using said precoded image data;

a coding unit configured to code the current image portion using the selected coding function; and a transmission unit configured to send the coded image portion to a decoder and for sending to said decoder information describing the choice function, and not also sending information describing the selected coding function.

16. A device for decoding at least one current image portion, comprising:

a receiving unit configured to receive a coded current image portion and for receiving information describing a choice function that has been used;

a selecting unit configured to select a decoding function from a finite set of decoding functions using said choice function and not also using received information describing a coding function, the selected decoding function being an appropriate decoding function among the finite set according to the choice function, said choice function using already-decoded data; and a decoding unit configured to decode the current image portion using the selected decoding function.

* * * * *